United States Patent
Andersson (10) Patent No.: US 10,830,824 B2
(45) Date of Patent: Nov. 10, 2020

(54) SYSTEM AND A METHOD FOR DETERMINING STATE-OF-CHARGE OF A BATTERY

(71) Applicant: CTEK Sweden AB, Vikmanshyttan (SE)

(72) Inventor: Helge Andersson, Gothenburg (SE)

(73) Assignee: CTEK SWEDEN AB, Vikmanshyttan (SE)

(*) Notice: Subject to any disclaimer, the term of this patent is extended or adjusted under 35 U.S.C. 154(b) by 348 days.

(21) Appl. No.: 15/764,532

(22) PCT Filed: Nov. 4, 2016

(86) PCT No.: PCT/SE2016/051088
§ 371 (c)(1),
(2) Date: Mar. 29, 2018

(87) PCT Pub. No.: WO2017/078606
PCT Pub. Date: May 11, 2017

(65) Prior Publication Data
US 2018/0284194 A1 Oct. 4, 2018

(30) Foreign Application Priority Data
Nov. 5, 2015 (SE) ........................................ 1551433

(51) Int. Cl.
*H01M 10/44* (2006.01)
*H01M 10/46* (2006.01)
(Continued)

(52) U.S. Cl.
CPC .......... *G01R 31/3842* (2019.01); *B60L 58/12* (2019.02); *G01R 31/367* (2019.01);
(Continued)

(58) Field of Classification Search
CPC ...... H02J 7/0026; H02J 7/0021; H02J 7/0047; H02J 2007/0049; H02J 2007/005;
(Continued)

(56) References Cited

U.S. PATENT DOCUMENTS 9,291,679 B2 * 3/2016 Yamada ............. G01R 31/3828
10,371,754 B2 * 8/2019 Guo ..................... G01R 31/367
(Continued)

FOREIGN PATENT DOCUMENTS

CN 103529393 A 1/2014
CN 103635822 A 3/2014
(Continued)

OTHER PUBLICATIONS

International Search Report for corresponding International Application No. PCT/SE2016/051088 dated Feb. 3, 2017.
(Continued)

*Primary Examiner* — Edward Tso
(74) *Attorney, Agent, or Firm* — Renner, Otto, Boisselle & Sklar, LLP (57) ABSTRACT

The invention relates to a method and a system for calculating a total state-of-charge of a battery, wherein the method comprises wherein the method comprises calculating the total state-of-charge as a coulomb counting state-of-charge, upon determining that the battery is charging. Determining an off period, which is the time period that the battery has not received charge, upon determining that the battery is no longer charging. calculating the total state-of-charge as a constant state of charge being equal to the coulomb counting state-of-charge, upon determining that the off period is shorter than a first time interval Calculating the state-of-charge as a function of the constant state-of-charge and an open circuit voltage state-of-charge determined by means of the voltage across the poles of the battery, upon determining
(Continued)

that the off period is shorter than a second time interval, and that the off period is longer than the first time interval. The method further comprises calculating the total state-of-charge by means of the open circuit voltage state-of-charge, upon determining that the off period is larger than the second time interval.

18 Claims, 4 Drawing Sheets

(51) Int. Cl.
  *G01R 31/3842* (2019.01)
  *G01R 31/367* (2019.01)
  *B60L 58/12* (2019.01)
  *H02J 7/00* (2006.01)
  *G01R 31/3835* (2019.01)

(52) U.S. Cl.
  CPC ........ *H02J 7/0047* (2013.01); *G01R 31/3835* (2019.01); *H02J 7/0048* (2020.01)

(58) Field of Classification Search
  CPC .......................... G01R 31/3842; G01R 31/382; G01R 31/387; G01R 31/388
  USPC ......... 320/132, 149, DIG. 21; 324/427, 430, 324/433
  See application file for complete search history.

(56) References Cited

U.S. PATENT DOCUMENTS

| | | |
|---|---|---|
| 2003/0076109 A1 | 4/2003 | Verbrugge et al. |
| 2004/0162683 A1 | 8/2004 | Verbrugge et al. |
| 2014/0368208 A1 | 12/2014 | Yamada |
| 2017/0033572 A1* | 2/2017 | Becker .................. H02J 7/0024 |
| 2018/0045787 A1* | 2/2018 | Hellgren ................. B60L 58/24 |

FOREIGN PATENT DOCUMENTS

| | | |
|---|---|---|
| CN | 104169733 A | 11/2014 |
| CN | 104515955 A | 4/2015 |

OTHER PUBLICATIONS

Written Opinion of the International Searching Authority for corresponding International Application No. PCT/SE2016/051088 dated Feb. 3, 2017.
Bree et al., "Prediction of Battery Behavior Subject to High-Rate Partial State of Charge", IEEE Transactions of Vehicular Technology, vol. 58, No. 2, Feb. 2009, pp. 588-595.
Chang, "The State of Charge Estimating Methods for Battery: A Review", ISRN Applied Mathematics, vol. 2013, Article ID 953792, 7 pages, retrieved from http://dx.doi.org/10.1155/2013/953792 on Mar. 15, 2018.
"AS8510 Data Acquisition Device for Battery Sensors", the reference design by ams AG in the integrated circuit , http://www.ams.com.eng/Products/Sensor-Interfaces/Data-Acquisition-Front-End/AS8510, 2018, pp. 1-48.

\* cited by examiner

SYSTEM AND A METHOD FOR DETERMINING STATE-OF-CHARGE OF A BATTERY

This application is a national phase of International Application No. PCT/SE2016/051088 filed Nov. 4, 2016 and published in the English language, which claims priority to Swedish Application No. 1551433-4 filed Nov. 5, 2015.

TECHNICAL FIELD OF THE INVENTION

The present invention relates to the field of determining the state-of-charge of a battery. Further, the present invention relates in particular to a method and a system for determining the state-of-charge of a battery.

BACKGROUND OF THE INVENTION

The state-of-charge of a battery is a measure in percent how much charge that is stored in the battery. A simple analogue metaphor is a fuel gauge that shows the available amount of fuel in the tank. However, it is very complicated to determine the state-of-charge for a battery in use. This is partly explained in terms of non-equilibrium states of the battery. In the art several attempts have been made to measure state-of-charge (SOC) of a battery, see for example the article Prediction of battery behavior subject to high-rate partial state of charge, Patrick J. van Bree et al., IEEE transactions of vehicular technology, vol. 58, no. 2, February 2009. This solution involves a fairly complicated model that uses seven parameters of which four are tune able. Other methods are discussed in the review article "The State of Charge Estimating Methods for Battery: A Review", Wen-Yeau Chang, ISRN Applied Mathematics Volume 2013, Article ID 953792, 7 pages http://dx.doi.org/10.1155/2013/953792.

Several different devices exists for determining the SOC by means of precise current and voltage measurements, see for example the reference design by AMS in the integrated circuit AS8510, http://www.ams.com./eng/Products/Sensor-Interfaces/Data-Acquisition-Front-End/AS8510. This solution requires a shunt resistor for measuring the current from/to the battery.

Thus, the current state of the art indicates the need for a simple and robust method for determining the state-of-charge of a battery over a broad range of operation conditions.

There is a problem in relation to determining the state-of-charge of a battery in a non-equilibrium state, such as a heated battery or a battery subject to charging.

Furthermore, there is a problem in determining the current flowing into/from the battery, since this determining involves the use of a current shunt i.e. a resistor with low resistance and a voltage detector used to detect the voltage drop over the resistor. For small currents the voltage drop over the shunt resistor may be cumbersome to detect.

OBJECT OF THE INVENTION

The present invention aims at obviating the aforementioned disadvantages and failings of previously known methods and systems for determining the state-of-charge, and at providing an improved method for determining the state-of-charge of a battery. A primary object of the present invention is to provide an improved method of the initially defined type, which allows the state-of-charge to be estimated in all conditions. It is another object of the present invention to provide a method for determining the state-of-charge based on voltage measurements across the poles of the battery. It is yet another object of the present invention to provide a system for determining the state-of-charge having a voltage logger and user equipment.

SUMMARY OF THE INVENTION

According to the invention at least the primary object is attained by means of the initially defined method and the method having the features defined in the independent claims. Preferred embodiments of the present invention are further defined in the dependent claims.

According to a first aspect of the present invention, there is provided a method for calculating a total state-of-charge of a battery, wherein the method comprises calculating the total state-of-charge as a coulomb counting state-of-charge, upon determining that the battery is charging. Determining an off period, which is the time period that the battery has not received charge, upon determining that the battery is no longer charging. Calculating the total state-of-charge being equal to the coulomb counting state-of-charge, upon determining that the off period is shorter than a first time interval. Calculating the state-of-charge as a function of the constant state-of-charge and an open circuit voltage state-of-charge determined by means of the voltage across the poles of the battery, upon determining that the off period is shorter than a second time interval, and that the off period is longer than the first time interval. The method further comprises calculating the total state-of-charge by means of the open circuit voltage state-of-charge, upon determining that the off period is larger than the second time interval.

The present invention is thus based on the insight that the total state-of-charge of a battery can be calculated by means of using several different calculations for the state-of-charge i.e. a coulomb counting state-of-charge when the battery receives charge, a constant state-of-charge equal to the coulomb counting state-of-charge during a first time interval after charging, and calculating the state-of-charge as a function of the constant state-of-charge and an open circuit voltage state-of-charge determined by means of the voltage across the poles of the battery, upon determining that the battery has not been charged during a second time interval, which second time interval comprises the first time interval.

According to a second aspect of the present invention, there is provided a system for determining a constant state-of-charge of a battery, comprising:
- a data logger configured to measure the voltage across the poles of the battery at a predetermined interval in time, wherein the data logger comprises a memory for storing the measured voltages, the data logger further comprises a communication link for sending data, wherein the data comprises voltages; and
- a user equipment configured to receive the data generated by the data logger from either the data logger, or a cloud service, wherein the user equipment comprises a memory and a processor, wherein the memory contains instructions for controlling the processor to perform the method according to any of claims 1 to 10.

Thus, the present invention is based on the insight that by combining several different methods of determining the state-of-charge of a battery during different time intervals, a very accurate estimate of the total state-of-charge is possible to attain.

In a preferred embodiment of the present invention, the method comprises calculating the total state-of-charge as a function of the constant state-of-charge and the open circuit voltage state-of-charge, based on a sum of a first function multiplied with the constant state-of-charge, which first function is a function of time, and a second function multiplied with the open circuit voltage state-of-charge, which second function is a function of time.

This means that the total state-of-charge is calculated as a sum of the constant state-of-charge and the open circuit voltage state-of-charge, wherein each contribution is multiplied with a weight factor being a function of time.

According to a preferred embodiment, the first function is equal to one in the end of the first time interval and equal to zero in the end of the second time interval, and wherein the second function is equal to zero in the end of the first time interval, and equal to one in the end of the second time interval. Thereby the total state-of-charge is determined by the constant state-of-charge in the end of the first time interval, and the total state-of-charge is determined by the open circuit state-of-charge in the end of the second time interval.

According to a preferred embodiment, the coulomb counting state-of-charge is calculated by means of the battery voltage, wherein the battery voltage is used to calculate the charging current delivered to the battery. This way, there is no need for a current shunt to determine the current to the battery. This is achieved in a preferred embodiment by means of determining if the battery voltage is above a predetermined threshold, if it is determined that the battery voltage is larger than a charging threshold voltage, a linear charging current is assumed. This linear charging current may be a function of the state-of-charge as determined in a previous assessment of the state-of-charge.

Further advantages with and features of the invention will be apparent from the other dependent claims as well as from the following detailed description of preferred embodiments.

BRIEF DESCRIPTION OF THE DRAWINGS

A more complete understanding of the abovementioned and other features and advantages of the present invention will be apparent from the following detailed description of preferred embodiments in conjunction with the appended drawings, wherein:

FIG. 6a-c are graphs with a magnified interval from FIG. 5, and FIG. 7a-c are graphs with a further magnified interval from FIG. 5 illustrating an embodiment of the method.

DETAILED DESCRIPTION OF PREFERRED EMBODIMENTS OF THE INVENTION

The following description is for illustration and exemplification of the invention only and is not intended to limit the invention to the specific embodiments described.

All references cited herein, including patents and patent applications are incorporated by reference in their entirety.

Unless defined otherwise, technical and scientific terms have the same meaning as commonly understood by one of ordinary skill in the art to which this invention belongs.

The meaning of the terms state-of-charge, and battery voltage as used herein are as follows.

The state-of-charge is defined as the remaining amount of charge in a battery, the state-of-charge is given in percent (%), wherein 100% corresponds to a fully charged battery.

The battery voltage is the voltage measured across the poles of the battery.

The open-circuit voltage, OCV, is the voltage measured across the poles of the battery, wherein the battery is unloaded i.e. no load or a very small load is connected to the battery. Within this application the open-circuit voltage may be the idle voltage over the battery when the battery is in an idle condition. For example when the vehicle is not in use during night time, in this state a small current is supplied to the on-board computer of the vehicle, nevertheless this battery voltage is assumed to be the open-circuit voltage.

Figure 1:
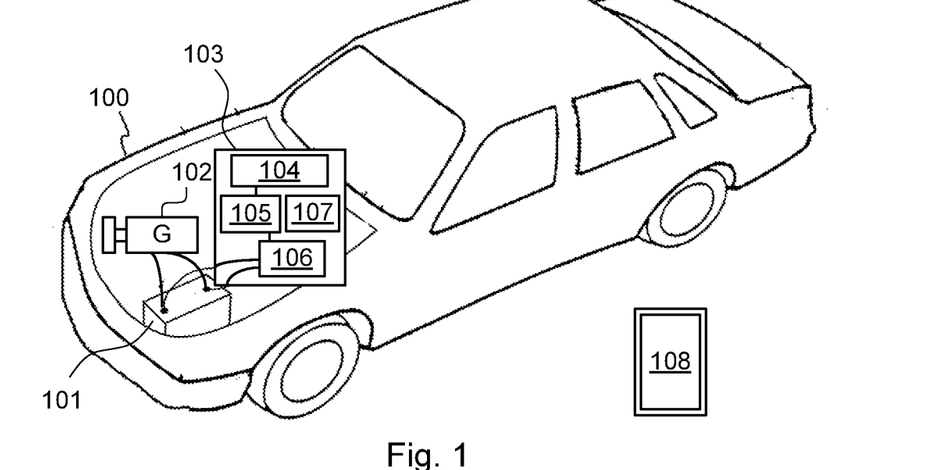
FIG. 1 is a perspective view of a system illustrating an embodiment of the invention.

Reference is initially made to FIG. 1 that is a schematic illustration of a vehicle, generally designated 100. The vehicle 100 is equipped with a battery 101, which may be provided for starting a main combustion engine, or for driving the vehicle. The vehicle also comprises a charging device 102, which may be a generator if the main engine is a combustion engine. If the main engine is an electrical motor the charging device may be charging circuit configured to be connected to an electrical grid for charging the battery 101. A data logging device 103 is connected across the poles of the battery 101 in order to measure the battery voltage. The data logging device 103 comprises a processor 105, a memory 104, and associated circuits 106 for measuring the battery voltage, such as an A/D-converter. The data logging device 103 is configured to measure the battery voltage at defined times, or regular intervals, or during certain states. The measured battery voltages are stored in the memory 104, preferably the memory is sufficiently large to accommodate at least 30000 battery voltage measurements with associated time stamps if the measurement interval is irregular. If the measurement interval is regular there may be no need to store the timing information.

The data logger 103 further comprises a communication circuit 107 configured to transmit the measured battery voltages in the memory 104 to an external user equipment 108 (UE) by means of for example radio communication such as Bluetooth, Z-wave, or Zigbee. However, the data transmission may also be performed by means of for example serial communication such as USB, between the data logger 103 and the UE 108. The UE 108 also comprises a processor and a memory, preferably the UE 108 may for example be a smartphone, or a tablet.

The memory of the UE 108 contains instructions for a method for determining the state-of-charge of the battery 101, which will be described below.

Figure 2:
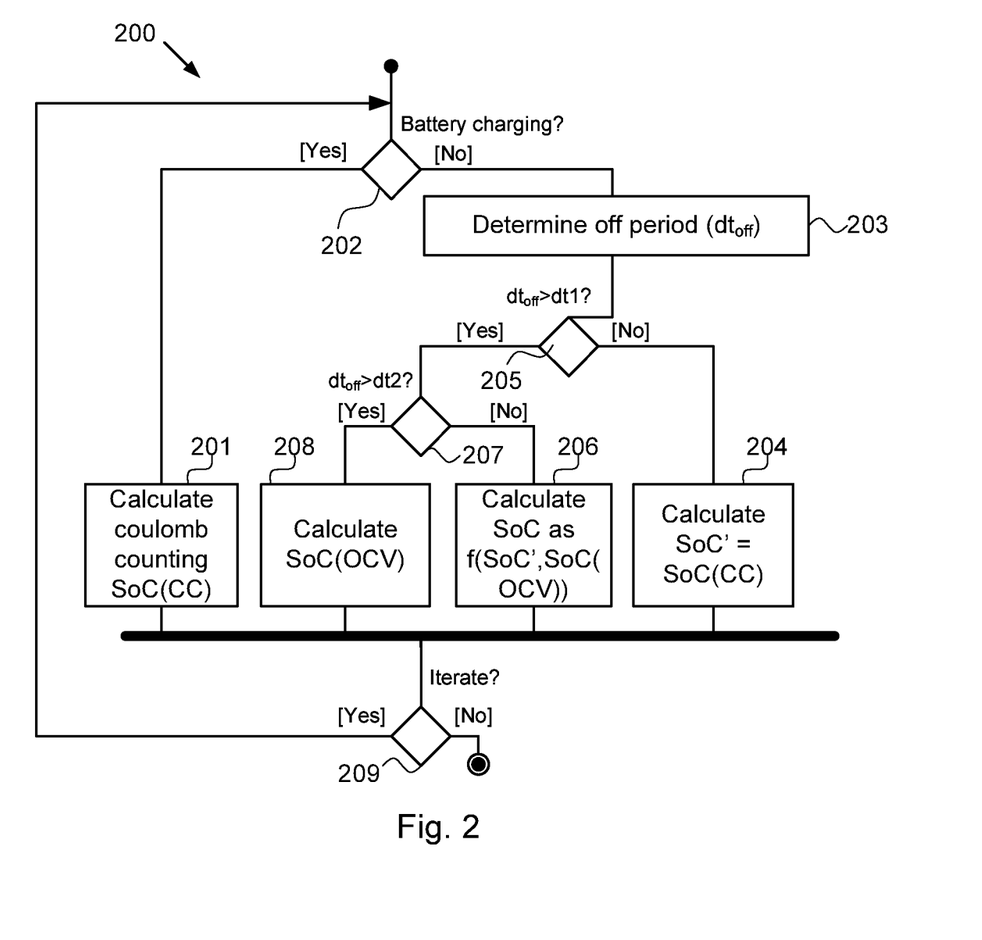
FIG. 2 is a flow-diagram illustrating an embodiment of the method.

Reference is now made primarily to FIG. 2, which shows a flow-diagram for a method, generally designated 200, for determining the total state-of-charge of the battery 101 by means of battery voltages measured by means of the data logger 103 and measured voltages transmitted therefrom to the UE 108.

The method 200 may comprise a step 201 of calculating the total state-of-charge as a coulomb counting state-of-charge, which is executed upon determining 202 that the battery is charging. The method of determining the state-of-charge by means of coulomb counting is well known in the art and involves bookkeeping the amount of charge delivered to the battery and the amount of charge discharged from the battery.

In one example, calculating the total state-of-charge as a coulomb counting state-of-charge involves obtaining a previously calculated total state-of-charge of 50% and a maximal capacity of the battery, e.g. 80 Ampere hours, thus giving a current charging level of the battery of 40 Ampere hours. The current and/or next total state-of-charge value can then be calculated 201 as a coulomb counting state-of-charge SoC(CC) by adding the previous calculation of the coulomb counting state-of-charge SoC(CC) or total state-of-charge, of 50%, and the estimated product of the estimated charging current multiplied with a predetermined time period, e.g. the sampling interval of the battery voltage, divided by the maximal capacity of the battery, 80 Ampere hours.

A step 203 of determining an off period, is executed upon determining 202 that the battery no longer is charging. The off period is defined as a measure of time between the actual time and the time when charging was interrupted.

A step 205 of determining if the off period (dtoff) is larger than a first time interval (dt1) is performed after the step 203.

If is determined that the off period is smaller than the first time interval (dt1) in step 205 a step 204 is then performed.

The step 204 comprises calculating the total state-of-charge as a constant state of charge being equal to the state-of-charge as determined in the step 201. This way the total state-of-charge will be equal to the state-of-charge as determined in the step 201 by means of coulomb counting, this means that during the first time interval the total state-of-charge will be constant and equal to the last state-of-charge as determined by means of coulomb counting. In this way non-equilibrium states during the first time interval will not affect the total state-of-charge.

After the first time interval the battery is assumed to gradually be more and more in an equilibrium state and a step 206 of calculating the state-of-charge as a function of the constant state-of-charge and an open circuit voltage state-of-charge determined by means of the voltage across the poles of the battery is executed, upon determining 207 that the off period is larger than the first time interval, and the off period is shorter than the second time interval. As time progresses from the end of the first time interval the total state-of-charge is more and more dependent upon calculating the state-of-charge by means of an open-circuit voltage measurement.

The step 206 of calculating the total state-of-charge as a function of the constant state-of-charge and the open circuit voltage state-of-charge, may in a preferred embodiment be based on a sum of:
 a first function multiplied with the constant state-of-charge, which first function is a function of time; and
 a second function multiplied with the open circuit voltage state-of-charge, which second function is a function of time.

In a preferred embodiment the above is implemented as:

$$SoC=(1-W)*SoC(CC)+W*SoC(OCV)$$

where SoC is state-of-charge and W is a parameter that goes from 0 to 1 from the end of the first time interval to the end of the second time interval. SoC(CC) is the state-of-charge determined by means of coulomb counting, and SoC(OCV) is the state-of-charge determined by means of the open-circuit voltage.

In the preferred embodiment, the parameter W is equal to 0 in the end of the first time interval and equal to 1 in the end of the second time interval, and there between W is linearly dependent on time.

In one example, the first function is defined as $1-W(d_{toff})$ and the second function is defined as $W(d_{toff})$. $W(d_{toff})$ is a parameter and/or a parameter function defined as:

$W(d_{toff})=0$, for $0<d_{toff}<dt1$, $W(d_{toff})$ goes strictly increasing from 0, when $d_{toff}=dt1$, to 1, when $d_{toff}=dt2$, $W(d_{toff})=1$, for $dt2<d_{toff}$.

$W(d_{toff})$ may go strictly increasing from 0 to 1 according to a linear, exponential or any other suitable strictly increasing function based on the off period ($d_{toff}$).

In the preferred embodiment the first time interval is in the interval from 3 hours to 7 hours, most preferably in the interval from 4 hours to 6 hours. This length of the first time interval has been found through experiments to be sufficient in order to be sure that the battery is an equilibrium state.

In the preferred embodiment the second time interval is in the interval from 8 hours to 12 hours, most preferably in the interval from 9 hours to 11 hours. After this second time interval, experiments has shown that a total state-of-charge determined by means of the open-circuit voltage is stable and robust.

Finally, after the second time interval, a step 208 of calculating the total state-of-charge by means of the open circuit voltage state-of-charge is executed, upon determining 207 that the off period is longer than the second time interval. From here on the state-of-charge is determined solely by the open circuit voltage.

The method 200 may be iterated if it is determined (209) to do so. A continuous iteration may be preferred if a monitoring of the state-of-charge is required. Otherwise the method 200 may be performed when a measurement of the state-of-charge is required.

This method provides an efficient way to precisely determine the state-of-charge of a battery based on historical battery voltage measurements. This will be elucidated further with reference made to performed experiments.

Figure 3:
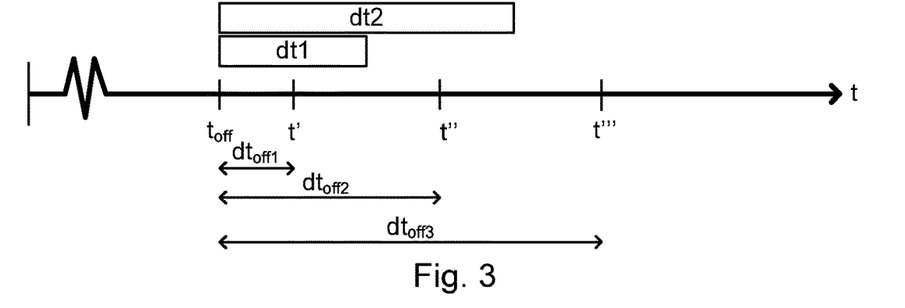
FIG. 3 is a time line illustrating an embodiment of the method.

Reference is now primarily made to FIG. 3, which shows a time line for a preferred embodiment of the method 200. The charging of the battery is interrupted at an off time (toff). The off-period at a first time t':

dtoff1=t'−toff

This off period dtoff1 is shorter than the first time interval (dt1), which gives that the total state-of-charge should be calculated as the state-of-charge as determined by means of coulomb counting (SoC(CC)) in a previous calculation.

At a second time t" the total state-of-charge is calculated as the above mentioned function of the state-of-charge as determined by means of coulomb counting, and the state-of-charge as determined by means of the open-circuit voltage. Since, the off period dtoff2 is shorter than the second time interval (dt2) and longer than the first time interval (dt1).

At a third time t''' the off period dtoff3 is longer than the second time interval dt2, which means that the total state-of-charge should be calculated by means of the open-circuit voltage.

As shown in FIG. 3 the second time interval dt2 is longer than the first time interval dt1.

Figure 4:
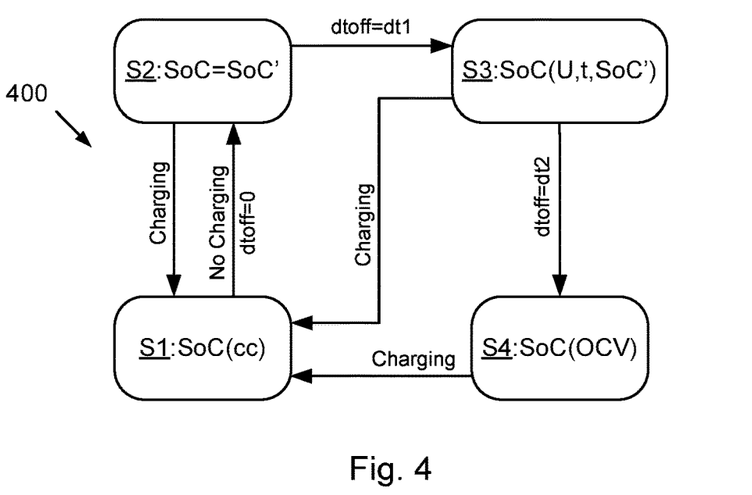
FIG. 4 is a state-diagram illustrating an embodiment of the method.

Reference is now primarily made to FIG. 4, which shows a state diagram, generally designated 400. The state diagram 400 provides another view of the method as described with reference made to FIG. 2.

The state diagram 400 comprises four different states:

S1: A state wherein the state-of-charge is determined by coulomb counting.

S2: A state wherein the state-of-charge is equal to the state-of-charge as determined in state S1 i.e. by means of coulomb counting. The off period starts upon entering state S2.

S3: A state wherein the state-of-charge is determined by a sum of a state-of-charge determined by means of the coulomb counting multiplied with a first function of time, and a state-of-charge determined by means of the open-circuit voltage of the battery multiplied by a second function of time.

S4: A state wherein the state-of-charge is determined by means of the open-circuit voltage of the battery.

A transition from state S1 to state S2 occurs when it is detected that the battery is not charging.

A transition from state S2 to state S3 occurs upon detecting that the off period is equal to, or longer than, the first time interval dt1.

A transition from state S3 to state S4 occurs upon detecting that the off period is equal to, or longer than, the second time interval dt2.

When any of state S2 to S4 is active and a charging of the battery is detected the state S1 becomes active, and the state-of-charge is determined by means of coulomb counting. Furthermore, the measurement of the off period is stopped.

In the preferred embodiment, the detection if the battery is charging is performed by measuring the battery voltage, and if the battery voltage is above a predetermined voltage it is assumed that the battery is charging. Furthermore, upon detection that the battery is above the predetermined voltage a linear charging current is assumed. This rough estimate of the charging current gives surprisingly good results that will be shown below with reference made to a performed experiment. This way, it may be unnecessary to have a current shunt connected in series with a pole of the battery i.e. low side current shunt or a high side current shunt. This is extremely useful since a current shunt able to withstand the high currents from a main battery in a vehicle is expensive and cumbersome to install.

Figure 5:
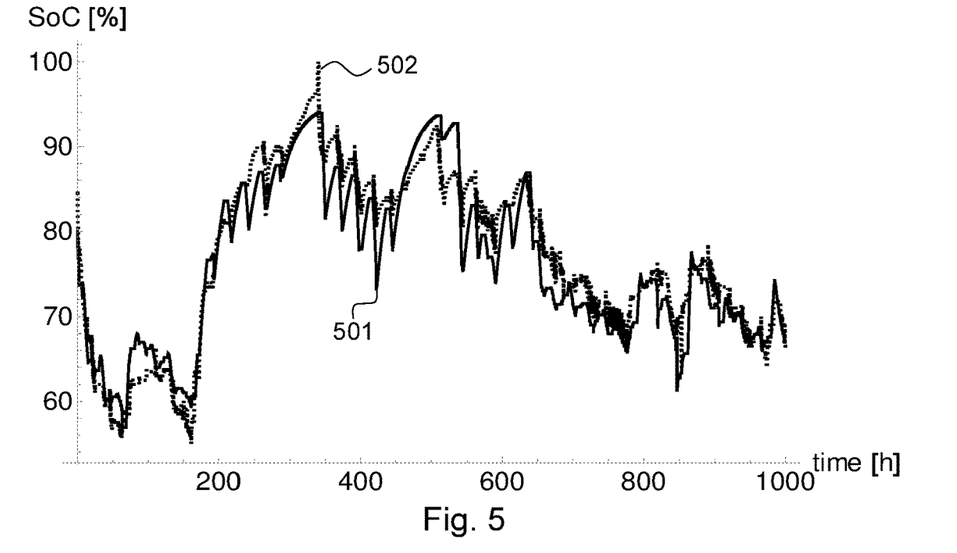
FIG. 5 is a graph from an experiment illustrating the fit between a reference sensor and an embodiment of the method.

Reference is now primarily made to FIG. 5, which is a graph illustrating the total state-of-charge determined with an embodiment of the method compared to a state of the art state-of-charge sensor which utilizes a current shunt. This graph encompasses logged data from 1000 hours use of a battery in a conventional car with a combustion engine (i.e. 12 V lead acid battery). A solid line 501 illustrates the estimated state-of-charge by means of the above disclosed method, and a dashed line 502 illustrates the state-of-charge as determined with a reference sensor which utilizes a current shunt. The overall estimated state-of-charge is surprisingly equal to the state-of-charge as estimated with the reference sensor.

In this preferred embodiment of the method the first time interval is equal to 5 hours and the second time interval is equal to 10 hours.

Figure 6:
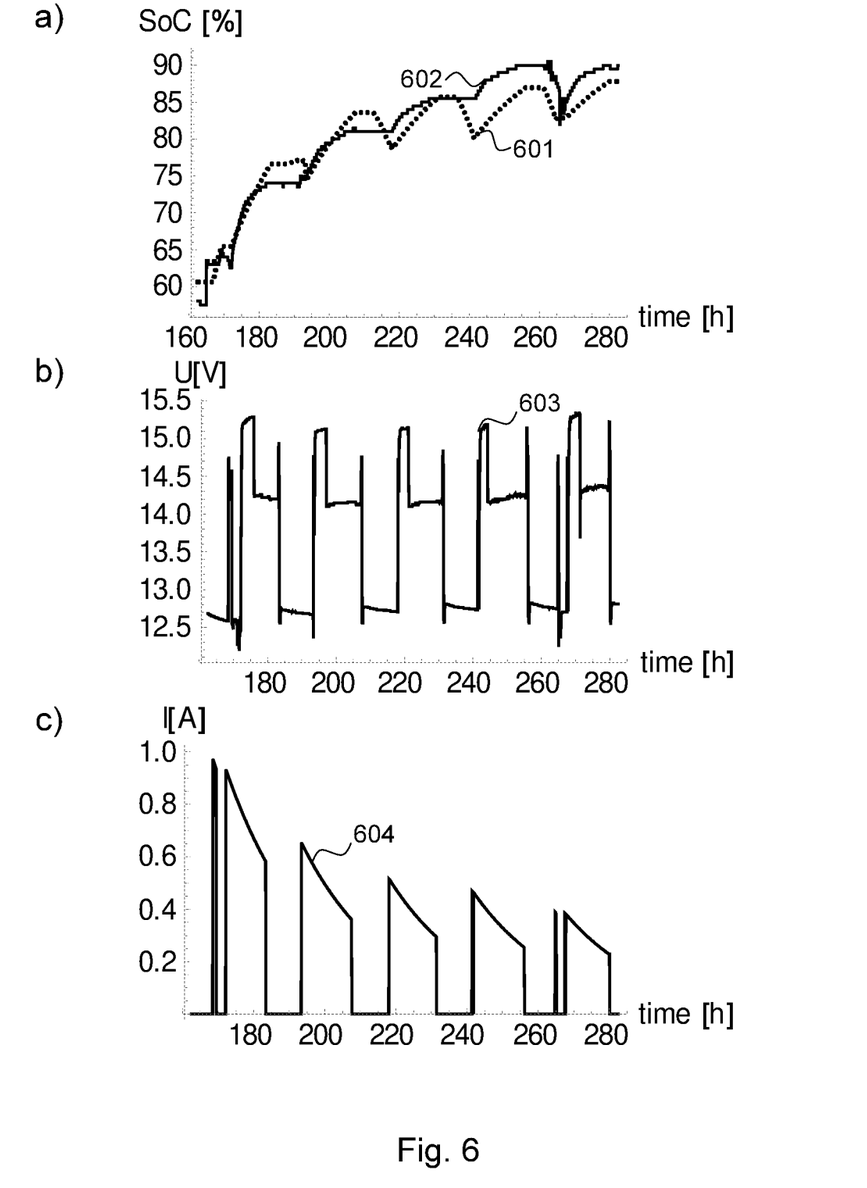

In order to further describe the method, reference is now made to FIG. 6 which shows a magnified interval from 160 to 280 hours of FIG. 5. In FIG. 6a the estimated state-of-charge is shown as a dashed curve 601, and the reference state-of-charge is shown as a solid curve 502. This FIG. 6a illustrates the beneficial features of the method according to the preferred embodiment.

In FIG. 6b the battery voltage 603 is shown and in FIG. 6c the estimated charging current 604 is shown. The sampling interval of the battery voltage is 5 minutes in this example. The charging current is estimated in the following way. If the measured battery voltage is above a charging voltage threshold the charging current is calculated as a, e.g. linear, function of the state-of-charge. In this example the charging voltage threshold is equal to 13.2 Volts. This is shown in FIG. 5b when the battery voltage is below the charging voltage threshold the corresponding estimated charging current in FIG. 5c is equal to zero. The estimation of the charging current utilizes the previous calculation of the state-of-charge in a linear function as long as the battery voltage is above the charging voltage threshold.

In one example, with reference to FIG. 2 as well as FIG. 6, the battery voltage, e.g. in the form of the open circuit voltage, OCV, is measured. It is then determined 202 that the battery is charging. Determining 202 that the battery is charging may be performed by detecting or determining that the battery voltage or open circuit voltage OCV is equal to or above the charging voltage threshold, e.g. 13.2 V. The charging current may then be calculated using a function dependent on a previous calculation of the coulomb counting state-of-charge SoC(CC) or total state-of-charge, e.g. based on a previous measurement of the battery voltage. The function may be based on an experience based relation, e.g. in the form of a look-up table LUT, based on measurements on state-of-charge and charging current of a charging battery. The total state-of-charge may then be calculated 201 as the coulomb counting state-of-charge SoC(CC) by adding the previous calculation of the coulomb counting state-of-charge SoC(CC) or total state-of-charge and the product of the charging current multiplied with a predetermined time period, e.g. the sampling interval of the battery voltage divided by the capacity of the battery. Furthermore, upon detection that the battery is below the charging voltage threshold is then determined 202 that the battery is not charging and that the charging current may then be calculated as zero Ampere (0 A).

Figure 7:
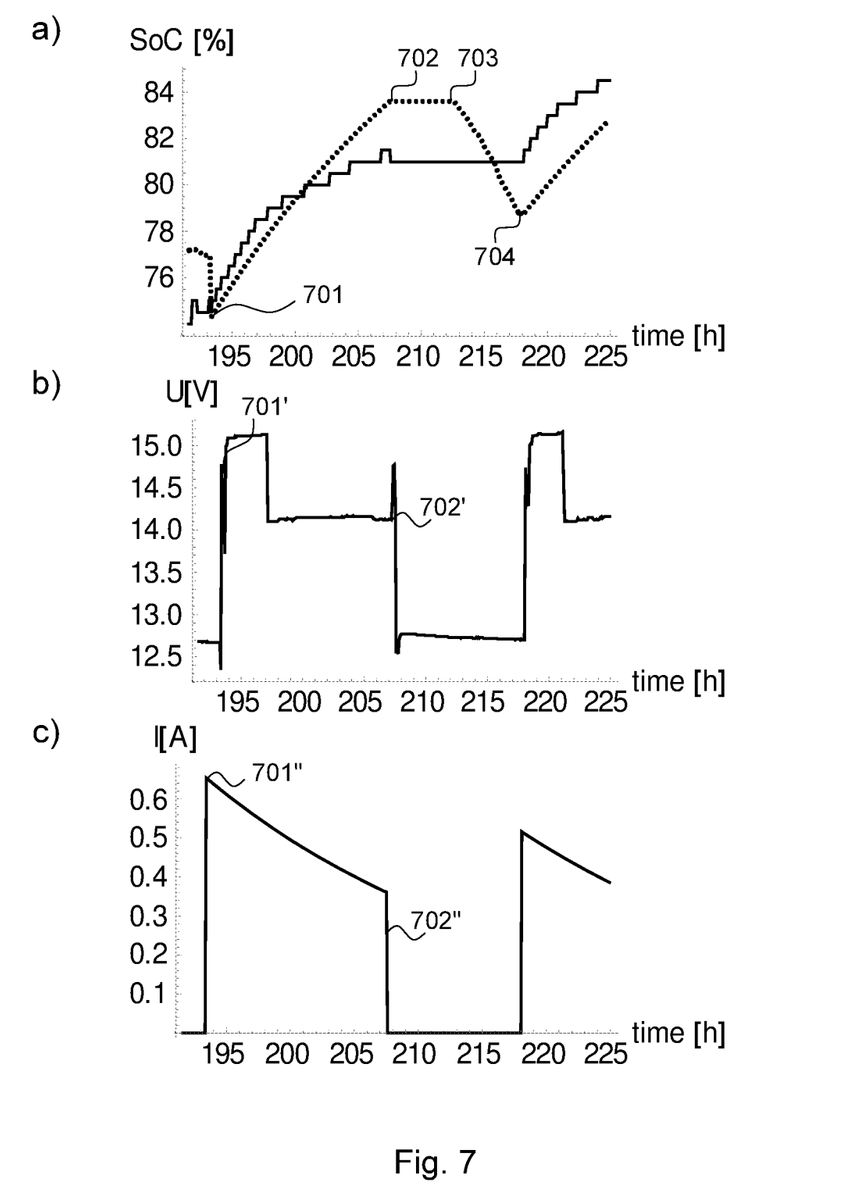

In FIG. 7 a further magnified interval between 190 hours and 225 hours of the experiment is illustrated. In a first point 701 in FIG. 7a the charging of the battery is started and this is detected by monitoring the batter voltage that rises above the charging voltage threshold, which in this embodiment is equal to 13.2 V, this is illustrated in FIG. 7b point 701'. The corresponding charging current is illustrated in FIG. 7c point 701" which is calculated by means of the state-of-charge in the preceding sample and the intercept and the slope of the linear relation between charging current and state-of-charge. The charging continues until 207.5 hours when the engine of the vehicle is stopped and the charging is interrupted 702", which is detected by means of measuring a battery voltage below the charging voltage threshold.

After the interrupt of the charging the state-of-charge is constant between point 702 and point 703, the lapsed time between point 702 and point 703 is equal to the first time interval, which in this embodiment is equal to 5 hours. After point 703 the state-of-charge is determined by means of the above disclosed method of weighting the state-of-charge determined by coulomb counting during charging and the state-of-charge as determined by means of the open circuit voltage. At point 704 the battery is subjected to charging and the total state-of-charge is determined by means of coulomb counting. When using the system illustrated in FIG. 1, the user equipment 108 is configured to receive logged battery voltages from the data logging device 103, this may in a preferred embodiment be based on Bluetooth communication, but of course other communication means are possible such as USB (wired) and WiFi (wireless).

Optionally, the system may be integrated in an apparatus within the vehicle, such that the driver continuously receives information about the state-of-charge of the battery.

The present invention is not limited to the above-described preferred embodiments. Various alternatives, modifications and equivalents may be used. Therefore, the above embodiments should not be taken as limiting the scope of the invention, which is defined by the appending claims.

Feasible Modifications of the Invention

The invention is not limited only to the embodiments described above and shown in the drawings, which primarily have an illustrative and exemplifying purpose. This patent application is intended to cover all adjustments and variants of the preferred embodiments described herein, thus the present invention is defined by the wording of the appended claims and the equivalents thereof. Thus, the equipment may be modified in all kinds of ways within the scope of the appended claims.

For instance, it shall be pointed out that the user equipment 108 and the data logging device 103 may be integrated in an apparatus configured to provide the user with information about the state-of-charge of the battery.

It shall also be pointed out that the invention is not limited to vehicles and associated methods, the method may also be useful in applications such as uninterruptible power supplies, which may use diesel engines for driving a generator. The method may also prove to be useful for determining the stat-of-charge for any battery subjected to charging.

It shall also be pointed out that all information about/concerning terms such as above, under, upper, lower, etc., shall be interpreted/read having the equipment oriented according to the figures, having the drawings oriented such that the references can be properly read. Thus, such terms only indicates mutual relations in the shown embodiments, which relations may be changed if the inventive equipment is provided with another structure/design.

It shall also be pointed out that even though it is not explicitly stated that features from a specific embodiment may be combined with features from another embodiment, the combination shall be considered obvious, if the combination is possible.

Throughout this specification and the claims which follows, unless the context requires otherwise, the word "comprise", and variations such as "comprises" or "comprising", will be understood to imply the inclusion of a stated integer or steps or group of integers or steps but not the exclusion of any other integer or step or group of integers or steps.

The invention claimed is:

1. A method for calculating a total state-of-charge of a battery, wherein the method comprises:
    calculating the total state-of-charge as a coulomb counting state-of-charge, upon determining that the battery is charging;
    determining an off period, which is the time period that the battery has not received charge, upon determining that the battery is no longer charging;
    calculating the total state-of-charge as a constant state of charge being equal to the coulomb counting state-of-charge, upon determining that the off period is shorter than a first time interval;
    calculating the total state-of-charge as a function of the constant state-of-charge and an open circuit voltage state-of-charge determined by means of the voltage across the poles of the battery, upon determining that the off period is shorter than a second time interval, and that the off period is longer than the first time interval;
    calculating the total state-of-charge by means of the open circuit voltage state-of-charge, upon determining that the off period is larger than the second time interval; and
    generating an output representative of an amount of charge remaining in the battery based on the calculation of the total state-of-charge;
    wherein calculating the total state-of-charge as a function of the constant state-of-charge and the open circuit voltage state-of-charge, based on a sum of:
    a first function multiplied with the constant state-of-charge, which first function is a function of the time period; and
    a second function multiplied with the open circuit voltage state-of-charge, which second function is a function of the time period.

2. The method according to claim 1, wherein the first function is equal to one in the end of the first time interval and equal to zero in the end of the second time interval, and wherein the second function is equal to zero in the end of the first time interval, and equal to one in the end of the second time interval.

3. The method according to claim 1, wherein the length of the first time interval is in the interval from 3 hours to 7 hours.

4. The method according to claim 3, wherein the length of the first time interval is in the interval from 4 hours to 6 hours.

5. The method according to claim 1, wherein the length of second time interval, is in the interval from 8 hours to 12 hours.

6. The method according to claim 5, wherein the length of second time interval, is in the interval from 9 hours to 11 hours.

7. The method according to claim 1, wherein the coulomb counting state-of-charge is calculated by means of the voltage across the poles of the battery, wherein the voltage across the poles of the battery is used to calculate the charging current delivered to the battery.

8. The method according to claim 7, wherein the charging current is calculated by means of a relation if the battery voltage is determined to be larger than a charging threshold voltage.

9. The method according to claim 8, wherein the charging current is calculated by means of a previous estimate of the total state-of-charge.

10. A system for determining a state-of-charge of a battery, comprising:
    a data logger configured to measure the voltage across the poles of the battery at a predetermined interval in time, wherein the data logger comprises a memory for storing the measured voltages, the data logger further comprises a communication link for sending data, wherein the data comprises voltages; and
    a user equipment configured to receive the data generated by the data logger from either the data logger, or a cloud service, wherein the user equipment comprises a memory and a processor, wherein the memory contains instructions for controlling the processor to perform the method according to claim 1.

11. A method for calculating a total state-of-charge of a battery, wherein the method comprises:
    determining an off period, which is the time period that the battery has not received charge, upon determining that the battery is no longer charging, calculating the total state-of-charge as a constant state of charge value, upon determining that the off period is shorter than a first time interval, or calculating the total state-of-charge as a function of the constant state-of-charge value and an open circuit voltage state-of-charge value determined by means of an open circuit voltage across the poles of the battery, upon determining that the off period is shorter than a second time interval, and that the off period is longer than the first time interval, or calculating the total state-of-charge as the open circuit voltage state-of-charge value, upon determining that the off period is larger than the second time interval; and generating an output representative of an amount of charge remaining in the battery based on the calculation of the total state-of-charge;

wherein calculating the total-state-of-charge as a function of the constant state-or charge and the open circuit voltage state-of-charge value comprises calculating a sum of:

a first function multiplied with the constant state-of-charge value, which first function is a function of the off period; and a second function multiplied with the open circuit voltage state-of-charge value, which second function is a function of the off period.

12. The method according to claim 11, wherein the first function is equal to one in the end of the first time interval and equal to zero in the end of the second time interval, and wherein the second function is equal to zero in the end of the first time interval, and equal to one in the end of the second time interval.

13. The method according to claim 11, wherein the constant state of charge value is calculated by means of a coulomb counting state-of-charge value calculated in a previous calculation.

14. The method of claim 13, wherein the coulomb counting state-of-charge value is calculated by means of the open circuit voltage, wherein the open circuit voltage is used to calculate a charging current delivered to the battery.

15. The method according to claim 14, wherein the charging current is calculated as a function of the coulomb counting state-of-charge value calculated in a previous calculation if the open circuit voltage is determined to be equal to or larger than a charging threshold voltage or calculated as equal to zero if the open circuit voltage is determined to be below the charging threshold voltage.

16. The method according to claim 11, wherein the length of the first time interval is in the interval from 3 hours to 7 hours.

17. The method according to claim 11, wherein the length of the second time interval is in the interval from 8 hours to 12 hours.

18. A system for determining a state-of-charge of a battery, comprising:

a data logger configured to measure an open circuit voltage across the poles of the battery at a predetermined interval in time, wherein the data logger comprises a memory for storing the measured voltages, the data logger further comprises a communication link for sending data, wherein the data comprises voltages; and a user equipment configured to receive the data generated by the data logger from either the data logger, or a cloud service, wherein the user equipment comprises a memory and a processor, wherein the memory contains instructions for controlling the processor to perform the method according to claim 11.

* * * * *